(12) United States Patent
Kim et al.

(10) Patent No.: US 7,737,712 B2
(45) Date of Patent: Jun. 15, 2010

(54) PROBE-TESTING DEVICE AND METHOD OF SEMICONDUCTOR DEVICE

(75) Inventors: Ki-Ho Kim, Kyoungki-do (KR); Ji-Eun Jang, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 32 days.

(21) Appl. No.: 11/967,729

(22) Filed: Dec. 31, 2007

(65) Prior Publication Data

US 2009/0002003 A1    Jan. 1, 2009

(30) Foreign Application Priority Data

Jun. 26, 2007    (KR) ...................... 10-2007-0063309

(51) Int. Cl.
*G01R 31/26* (2006.01)
*G01R 35/00* (2006.01)

(52) U.S. Cl. .................. 324/757; 324/765; 324/601

(58) Field of Classification Search ................ 324/601, 324/130, 202, 74, 754, 757, 765, 437, 445, 324/446, 690, 696, 715, 724

See application file for complete search history.

(56) References Cited

U.S. PATENT DOCUMENTS

| | | | |
|---|---|---|---|
| 5,263,031 A | 11/1993 | Inoue | |
| 5,687,180 A | 11/1997 | Kawasaki | |
| 6,115,298 A * | 9/2000 | Kwon et al. | 365/198 |
| 6,163,499 A * | 12/2000 | Suzuki | 365/230.06 |
| 6,300,757 B1 * | 10/2001 | Janssen | 324/158.1 |
| 6,606,575 B2 * | 8/2003 | Miller | 702/104 |
| 6,788,082 B2 * | 9/2004 | Hirao | 324/757 |
| 6,809,975 B2 | 10/2004 | Yamaoka et al. | |
| 6,839,286 B2 * | 1/2005 | Cho et al. | 365/189.05 |
| 7,051,130 B1 | 5/2006 | Horowitz et al. | |
| 7,227,376 B2 * | 6/2007 | Ahmad et al. | 326/30 |
| 7,557,603 B2 * | 7/2009 | Pan | 326/30 |
| 2007/0285111 A1 * | 12/2007 | Campbell | 324/754 |

FOREIGN PATENT DOCUMENTS

| | | |
|---|---|---|
| JP | 01288782 A * | 11/1989 |
| JP | 09-106698 | 4/1997 |
| JP | 2000-180511 | 6/2000 |
| JP | 2001-274323 | 10/2001 |
| JP | 2003-317499 | 11/2003 |
| JP | 2005-071582 | 3/2005 |
| KR | 20-0302441 | 1/2003 |
| KR | 1020030004474 | 1/2003 |

* cited by examiner

*Primary Examiner*—Hoai-An D Nguyen
(74) *Attorney, Agent, or Firm*—IP & T Law Firm PLC

(57) ABSTRACT

A probe-testing device includes probe tips configured to apply inputs to pads of a semiconductor chip, wherein one of the probe tips is connected to a calibration pad for impedance adjustment and a calibration resistor is connected thereto.

4 Claims, 4 Drawing Sheets

PROBE-TESTING DEVICE AND METHOD OF SEMICONDUCTOR DEVICE

CROSS-REFERENCE TO RELATED APPLICATIONS

The present invention claims priority of Korean patent application number 10-2007-0063309, filed on Jun. 26, 2007, which is incorporated by reference in its entirety.

BACKGROUND OF THE INVENTION

The present invention relates to a testing of calibration operation for an impedance adjusting used in various semiconductor integrated circuits such as a semiconductor memory device, and more particularly, to a probe-testing device and a probe-testing method of a semiconductor device capable of testing a calibration operation at wafer level.

Semiconductor devices are implemented into integrated circuit (IC) chips such as central processing units (CPUs), memories, and gate arrays, and are incorporated into a variety of electrical products such as personal computers, servers and workstations. Most of semiconductor devices include a receiving circuit configured to receive signals from an outside world via input pads and an output circuit configured to provide internal signals to an outside world via output pads.

As the operating speed of electrical products is increasing, a swing width of a signal exchanged between semiconductor devices is being gradually reduced for minimizing a delay time taken for signal transmission. However, the reduction in the swing width of the signal has a great influence on an external noise, causing the signal reflectance to become more critical at an interface terminal due to impedance mismatch. Such impedance mismatch is generally caused by an external noise, a variation of a power voltage, a change of an operating temperature, a change of a manufacturing process, etc. The impedance mismatch may lead to a difficulty in a high-speed transmission of data and a distortion in output data. Therefore, if semiconductor devices receive the distorted output signal through an input terminal, it frequently gives rise to problems such as a setup/hold failure and an error in decision of an input level.

In particular, in order to resolve the above problems, a memory device requiring high-speed performance employs an impedance adjusting circuit near around an input pad inside an IC chip. In a typical impedance adjusting circuit scheme, source termination is performed at a transmitting end by an output circuit, and parallel termination is performed by a termination circuit connected in parallel with respect to a receiving circuit coupled to the input pad.

A ZQ calibration refers to a procedure of generating pull-up and pull-down codes which are varied with PVT (process, voltage and temperature) conditions. The resistance of the impedance adjusting circuit, e.g., a termination resistance at a DQ pad in a memory device, is calibrated using the codes resulting from the ZQ calibration. Here, the term of ZQ calibration is attributed to the fact that the calibration is performed using a ZQ node.

Hereinafter, how the ZQ calibration is performed in an impedance adjusting circuit will be described.

FIG. 1 is a block diagram of a calibration circuit for performing a ZQ calibration in a conventional impedance adjusting circuit.

Referring to FIG. 1, the conventional impedance adjusting circuit configured to perform ZQ calibration includes a first calibration resistor circuit 110, a second calibration resistor circuit 120 and 130, a reference voltage generator 102, first and second comparators 103 and 104, and pull-up and pull-down counters 105 and 106. The first calibration resistor circuit 110 is provided with a plurality of pull-up resistors that are turned on/off in response to a pull-up calibration code PCODE<0:N>. The second calibration resistor circuit 120 and 130 includes a pull-up calibration resistor unit 120 and a pull-down calibration resistor unit 130. Here, the pull-up calibration resistor unit 120 has the same construction as the first calibration resistor circuit 110. The pull-down calibration resistor unit 130 is provided with a plurality of pull-down resistors that are turned on/off in response to a pull-down calibration code NCODE<0:N>.

The first calibration resistor circuit 110 generates the pull-up calibration code PCODE<0:N> primarily while being calibrated with an external resistor 101 connected to a ZQ node. The second calibration resistor circuit 120 and 130 generates the pull-down calibration code NCODE<0:N> secondarily using the pull-up calibration code PCODE<0:N> which has been generated through the first calibration resistor circuit 110.

The first comparator 103 compares a ZQ node voltage at the ZQ node with a reference voltage VREF (generally, set to VDDQ/2) generated from the reference voltage generator 102, thereby generating up/down signals UP/DOWN. Herein, the ZQ node voltage is generated by coupling the first calibration resistor circuit 110 to the external resistor 101 (generally, 240Ω) connected to a ZQ pin that is disposed outside a chip of the ZQ node.

The pull-up counter 105 receives the up/down signals UP/DOWN to generate the pull-up calibration code PCODE<0:N> as a binary code, which turns on/off the pull-up resistors connected in parallel in the first calibration resistor circuit 110, thereby calibrating total resistance of the first calibration resistor circuit 110. The calibrated resistance of the first calibration resistor circuit 110 affects the ZQ node voltage again, and the above-described calibration procedure is then repeated. That is, the first calibration resistor circuit 110 is calibrated such that the total resistance of the first calibration resistor circuit 110 is equal to resistance of the external resistor 101, which is called a pull-up calibration.

The binary code, i.e., the pull-up calibration code PCODE<0:N>, generated during the pull-up calibration is inputted into the pull-up calibration resistor unit 120 of the second calibration resistor circuit 120 and 130, thereby determining total resistance of the pull-up calibration unit 120. Thereafter, a pull-down calibration starts to be performed in a similar manner to the pull-up calibration. Specifically, the pull-down calibration unit 130 is calibrated such that a voltage of a node A is equal to the reference voltage VREF using the second comparator 104 and the pull-down counter 106, that is, the total resistance of the pull-down calibration resistor unit 130 is equal to the total resistance of the pull-up calibration resistor unit 120, which is called the pull-down calibration.

The binary codes PCODE<0:N> and NCODE<0:N> resulting from the ZQ calibration, i.e., pull-up and pull-down calibrations, are inputted to pull-up and pull-down resistors (termination resistors) at input/output pads, which are identically configured to the pull-up and pull-down calibration resistor units in the calibration circuit of FIG. 1, thus determining resistance of the impedance adjusting circuit. In a memory device, resistances of pull-up and pull-down resistors at a DQ pad are determined.

FIG. 2 is a block diagram illustrating how termination resistance of an output driver of a semiconductor memory device is determined using the calibration codes PCODE<0:N> and NCODE<0:N> generated from the calibration circuit of FIG. 1.

The output driver configured to output data in the semiconductor memory device includes first and second pre-drivers 210 and 220 located at its upper and lower parts, and pull-up and pull-down termination resistor units 230 and 240 for outputting data.

The first and second pre-drivers 210 and 220 control the pull-up termination resistor unit 230 and the pull-down resistor unit 240, respectively. When outputting a data having a logic high level, the pull-up termination resistor unit 230 is turned on so that a data pin DQ goes to 'HIGH' state. On the contrary, when outputting a data having a logic low level, the pull-down termination resistor unit 240 is turned on so that the data pin DQ goes to 'LOW' state. That is, the data pin DQ is pull-up or pull-down terminated to thereby output data of a logic high level or a logic low level.

At this time, the number of resistors in the pull-up and pull-down termination resistors 230 and 240 to be turned on is determined by the pull-up and pull-down calibration codes PCODE<0:N> and NCODE<0:N>. Specifically, which resistor unit is turned on between the pull-up and pull-down termination resistor units 230 and 230 is mainly determined depending on a logic level of output data, but which resistor is turned on among the termination resistors provided in one of the termination resistor units 230 and 240 that has been selected to be turned on is determined by the pull-up calibration code PCODE<0:N> or pull-down calibration code NCODE<0:N>.

For reference, target resistances of the pull-up and pull-down resistor units 230 and 240 are not necessarily equal to resistances (240Ω) of the first and second resistor circuits (see "110", "120" and "130" of FIG. 1) but may have a resistance of one-half (120Ω) or one-quarter (60Ω) of 240Ω, etc. In FIG. 2, reference symbols "DQP_CTRL" and "DQN_CTRL" inputted to the first and second pre-drivers 210 and 220 denote various control signals exemplarily.

FIG. 3 is a view illustrating a conventional probe-testing device.

Specifically, FIG. 3 illustrates a probe-testing device (also referred to as a probe card because it is shaped like a card) fabricated according to general leads on center rule. The probe-testing device performs testing whether a semiconductor chip normally operates or not by applying a desired input to each pad of the semiconductor chip and then measuring a signal outputted according to the applied input.

As shown in FIG. 3, the conventional probe-testing device includes a plurality of probe tips, which are divided into a power tip configured to supply power such as VDD/VDDQ, a ground tip, a signal tip configured to receive/output a signal.

As described above, the calibration operation for the impedance adjusting circuit of the semiconductor device is performed using the external resistance coupled to the ZQ pad as a reference. When performing probe testing upon a wafer, the ground tip is connected to the ZQ pad because the ZQ pad is neither the pad receiving power nor the pad receiving/outputting a signal. Therefore, there is a problem in that it is impossible to test the ZQ calibration during probe testing because the external resistor is not connected to the ZQ pad.

Moreover, even if signal tips or power tips instead of the ground tip are connected to the ZQ pad, data for the external resistor cannot be detected like the case where the ZQ pad is connected to the ground, making it impossible to test the ZQ calibration during probe testing.

Accordingly, the conventional probe-testing device has a problem in that it is not possible to verify the ZQ calibration through probe testing at wafer level but possible to test the ZQ calibration only after package.

SUMMARY OF THE INVENTION

Embodiments of the present invention are directed to providing a probe testing device and a probe testing method of a semiconductor device capable of testing a calibration operation for an impedance adjusting even during a probe testing performed upon a wafer.

In accordance with a first aspect of the present invention, there is provided a probe-testing device, including probe tips configured to apply inputs to pads of a semiconductor chip, wherein one of the probe tips is connected to a calibration pad for impedance adjustment and a calibration resistor is connected thereto.

In accordance with a second aspect of the present invention, there is provided probe-testing device, including probe tips configured to apply inputs to pads of a semiconductor chip, wherein one of the probe tips is connected to a calibration pad for impedance adjusting and has a resistance substantially equal to that of an external calibration resistor.

In accordance with a third aspect of the present invention, there is provided a probe-testing method of a semiconductor chip, including: connecting a plurality of probe tips to pads of the semiconductor chip; and connecting a resistor to one of the plurality of probe tips connected to a calibration pad for impedance adjusting.

DESCRIPTION OF SPECIFIC EMBODIMENTS

Hereinafter, a probe testing device and a probe testing method of a semiconductor device in accordance with the present invention will be described in detail with reference to the accompanying drawings.

Figure 4:
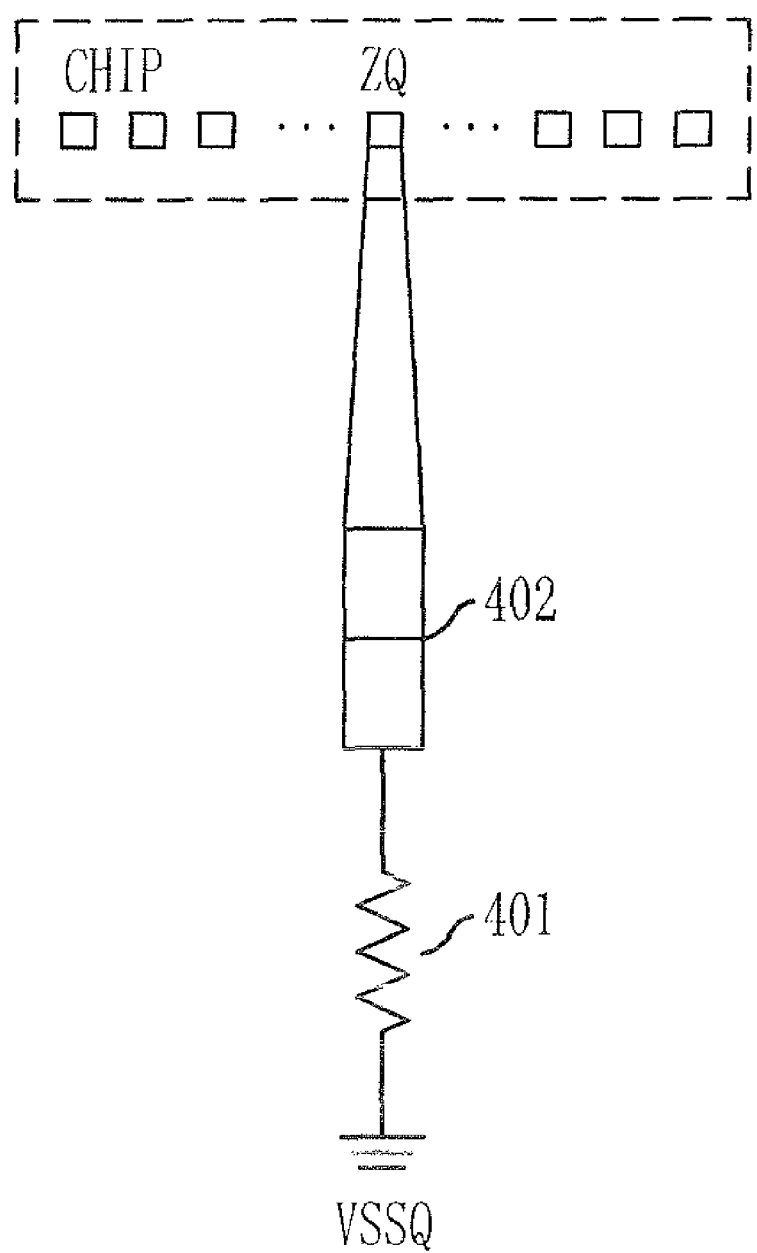
FIG. 4 is a view illustrating one of probe tips in a probe-testing device in accordance with an embodiment of the present invention.

FIG. 4 is a view illustrating one of probe tips in a probe-testing device in accordance with an embodiment of the present invention.

Figure 3:
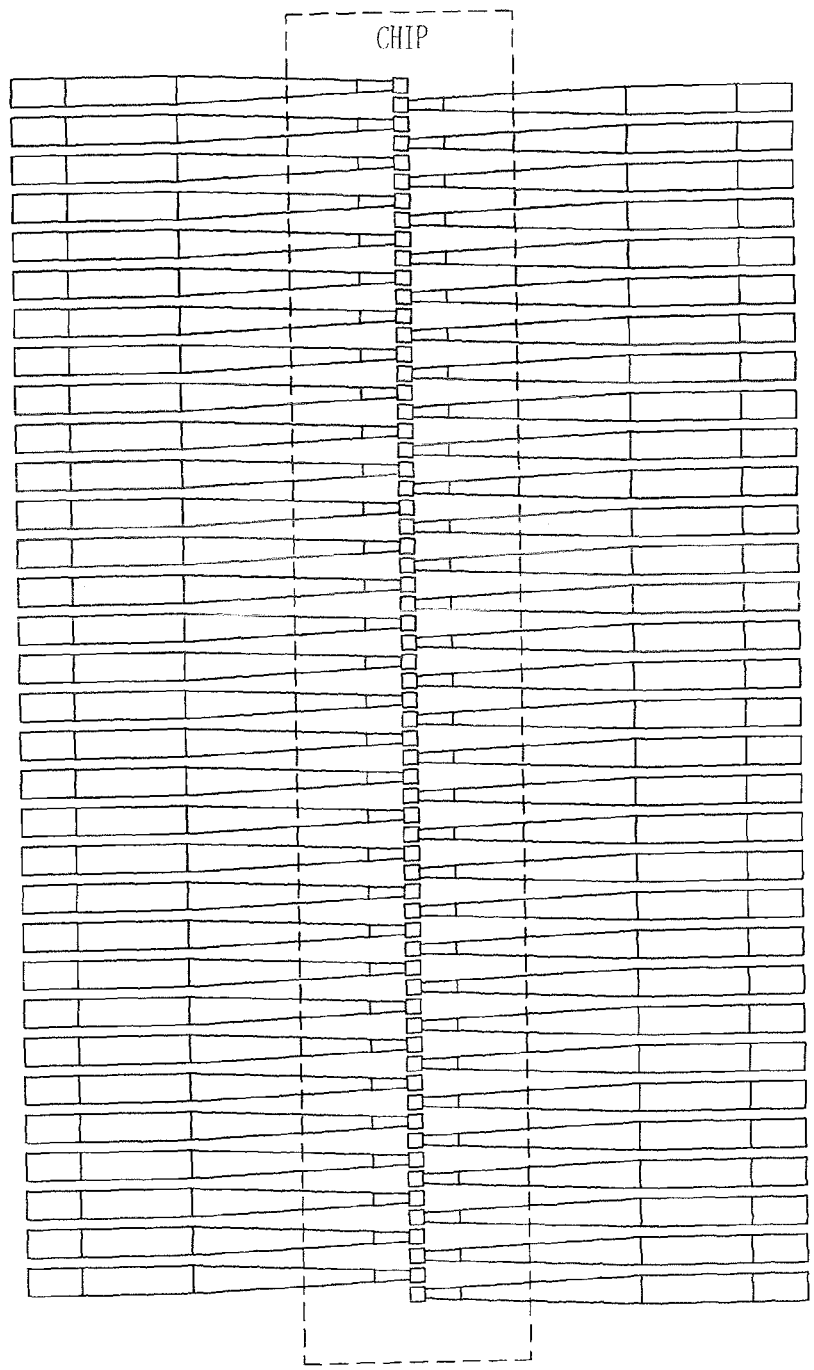
FIG. 3 is a view illustrating a conventional probe-testing device.

The probe-testing device in accordance with the present invention includes a plurality of probe tips configured to apply inputs to pads of a semiconductor chip as illustrated in FIG. 3. Among the probe tips, a probe tip 402 connected to a calibration pad (ZQ) for an impedance adjusting includes a probe resistor 401 for calibration connected to the probe tip 402 itself, as illustrated in FIG. 4.

The resistor 401 may have various resistances depending on a calibration target resistance, and generally has 240Ω to date. The calibration pad (ZQ) is referred as a ZQ pad.

Figure 1:
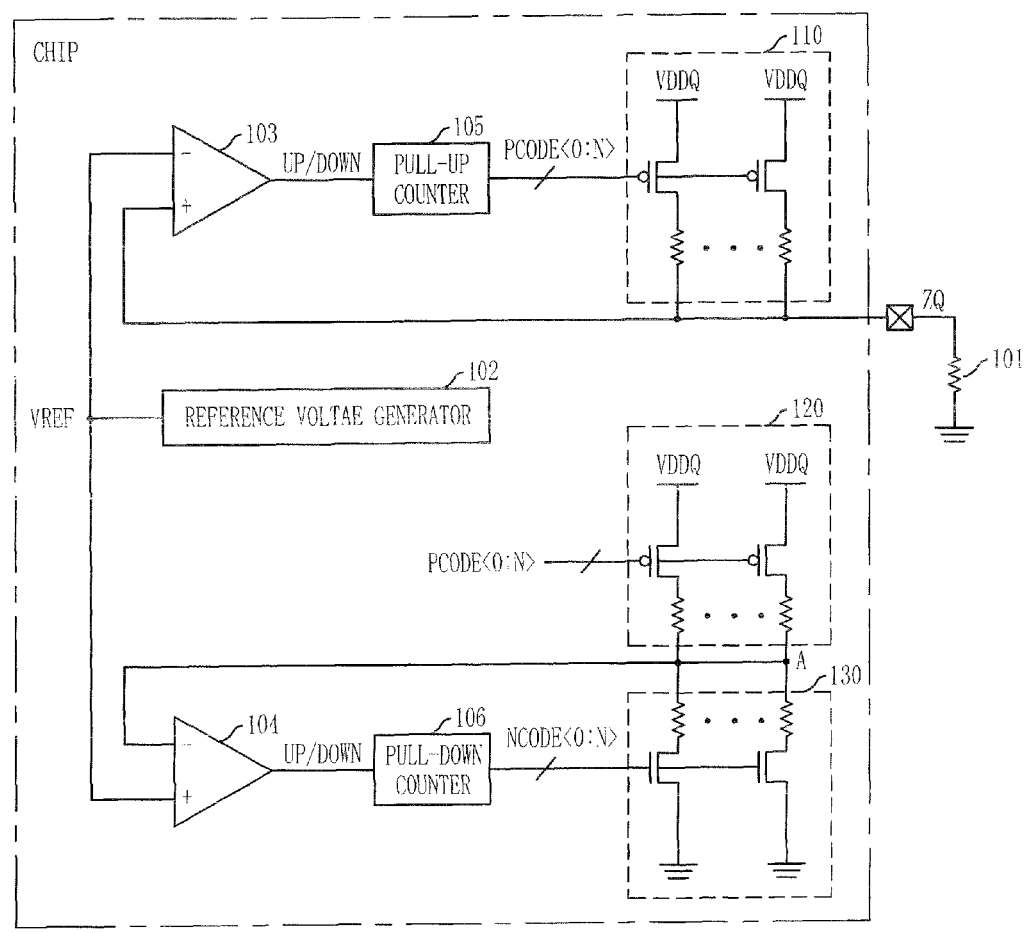
FIG. 1 is a block diagram of a calibration circuit for performing a ZQ calibration in a conventional impedance adjusting circuit.
Figure 2:
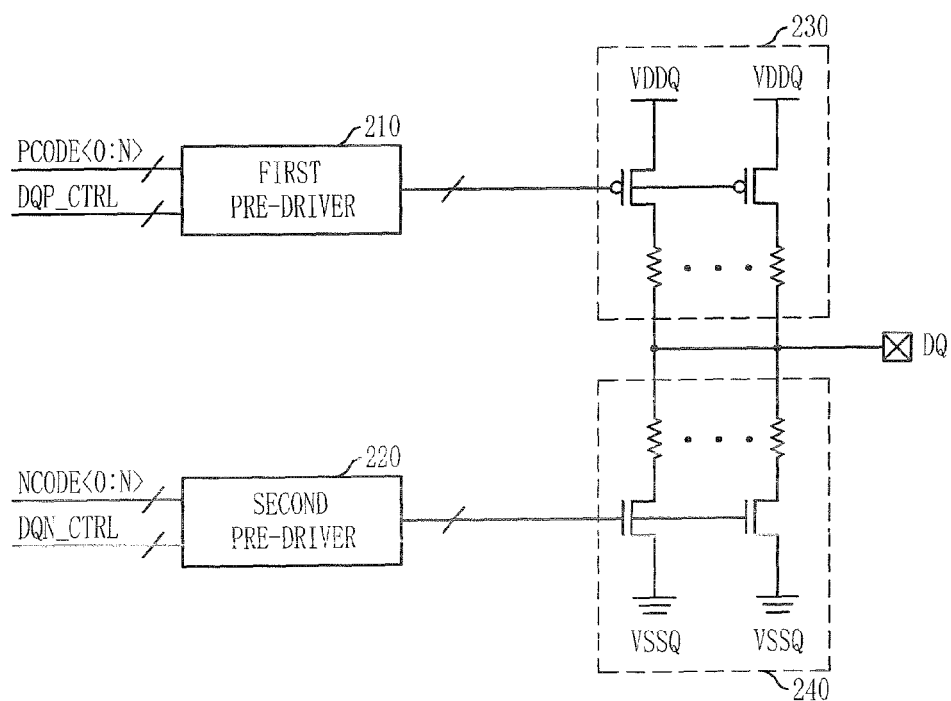
FIG. 2 is a block diagram illustrating how termination resistance of an output driver of a semiconductor memory device is determined using calibration codes generated from the calibration circuit of FIG. 1.

In detail, an external resistor is generally grounded as shown in FIG. 1, and thus one end of the probe resistor 401 is also connected to a ground terminal in the present invention. Although one end of the probe resistor 401 is grounded and the other end is connected to a bottom end of the probe tip 402 in FIG. 4, one end of the probe tip 402 instead of the probe resistor 401 may be grounded if the probe resistor 401 is connected to a top end of the probe tip 402.

In the embodiment of FIG. 4, the probe resistor 401 is grounded because the external resistor, which is a reference resistor of the calibration operation, is typically used as a pull-down resistor up to date. Alternatively, if the external resistor is used as a pull-up resistor, the probe resistor 401 may be connected to a power supply terminal VDDQ or VDD. In this case, the calibration circuit performs a pull-down calibration to generate pull-down calibration codes NCODE<0:N> first and then performs a pull-up calibration to generate pull-up calibration codes PCODE<0:N> on the basis of the pull-down calibration codes NCODE<0:N>.

As another embodiment of the present invention, the probe resistor 401 is not connected to the probe tip 402 but the probe tip 402 itself may have the same resistance as the external resistor. In this case, the probe-testing device in accordance with the present invention includes a plurality of probe tips configured to apply desired inputs to the pads of the semiconductor chip. Among the probe tips, the probe tip 402 connected to the ZQ pad for impedance adjusting has the same resistance as the resistor for calibration, e.g., 240Ω. One end of the probe tip 402 is also grounded.

As for operation, because the probe resistor 401 is connected to the ZQ pad during probe testing, a pull-up calibration is performed in such a manner that the first calibration resistor circuit (see reference numeral "110" of FIG. 1) has the same resistance as the probe resistor 401, thus generating the pull-up calibration codes PCODE<0:N>. Thereafter, the pull-down calibration codes NCODE<0:N> are generated through the second calibration resistor circuit (see reference numerals "120" and "130" of FIG. 1) on the basis of the generated pull-up calibration codes PCODE<0:N>.

Referring to FIG. 4 again, a probe testing method of a semiconductor device in accordance with the present invention includes: connecting a plurality of probe tips to pads of a semiconductor chip; and connecting a probe resistor 401 for calibration to a probe tip 402 connected to a calibration pad (ZQ) for impedance adjusting among the plurality of probe tips. The probe testing method of the semiconductor device may further include grounding one end of the probe resistor 401.

In this case, since the intrinsic resistance of the probe tip 402 also has an influence on the calibration operation, it is desirable that the intrinsic resistance of the probe tip 402 should be specified by a manufacturer of the probe tip 402.

As described above, in accordance with the present invention, a calibration test for one die termination is possible even during a probe testing performed upon a wafer by connecting a resistor to a probe tip connected to a calibration pad. Therefore, it can be easier to verify the calibration operation, thus detecting failures or defects in the early stage even before being packaged.

While the present invention has been described with respect to the specific embodiments, it will be apparent to those skilled in the art that various changes and modifications may be made without departing from the spirit and scope of the invention as defined in the following claims.

What is claimed is:

1. A probe-testing device, comprising:
   probe tips configured to apply inputs to pads of a semiconductor chip,
   wherein one of the probe tips is connected between a calibration pad and a ground voltage terminal for impedance adjusting and has a resistance substantially equal to an external calibration resistance.

2. The probe-testing device of claim 1, wherein the calibration pad comprises a ZQ pad.

3. A probe-testing method for a semiconductor chip, comprising:
   connecting a plurality of probe tips to pads of the semiconductor chip; and
   connecting a ground voltage terminal to one of the plurality of probe tips connected to a calibration pad for impedance adjusting.

4. The probe-testing method of claim 3, wherein the one of the plurality of probe tips connected to the ground voltage terminal has a resistance substantially equal to an external calibration resistance.

* * * * *